United States Patent
Chidambarrao et al.

(10) Patent No.: US 7,759,739 B2
(45) Date of Patent: Jul. 20, 2010

(54) TRANSISTOR WITH DIELECTRIC STRESSOR ELEMENTS

(75) Inventors: Dureseti Chidambarrao, Weston, CT (US); Brian J. Greene, Yorktown heights, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1088 days.

(21) Appl. No.: 11/163,683

(22) Filed: Oct. 27, 2005

(65) Prior Publication Data

US 2007/0096215 A1     May 3, 2007

(51) Int. Cl.
*H01L 29/94* (2006.01)
(52) U.S. Cl. ...................... 257/368; 257/374
(58) Field of Classification Search ................ 257/368, 257/374, 99; 438/207
See application file for complete search history.

(56) References Cited

U.S. PATENT DOCUMENTS

| | | | |
|---|---|---|---|
| 4,683,637 A * | 8/1987 | Varker et al. | ................. 438/294 |
| 6,717,216 B1 | 4/2004 | Doris et al. | |
| 6,884,667 B1 | 4/2005 | Doris et al. | |
| 7,190,036 B2 * | 3/2007 | Ko et al. | ...................... 257/374 |
| 2004/0113174 A1 | 6/2004 | Chidambarrao et al. | |
| 2005/0067294 A1 | 3/2005 | Choe et al. | |
| 2007/0020861 A1 * | 1/2007 | Chong et al. | ................. 438/296 |

FOREIGN PATENT DOCUMENTS

CN      1507071 A     6/2004

OTHER PUBLICATIONS

W. Theiss, "" (Article), *Surface Science Reports*, vol. 29, pp. 91-192 (1997).

* cited by examiner

*Primary Examiner*—Wai-Sing Louie
*Assistant Examiner*—Bilkis Jahan
(74) *Attorney, Agent, or Firm*—H. Daniel Schnurmann; Daryl K. Neff (57) ABSTRACT

A chip is provided which includes an active semiconductor region and a field effect transistor ("FET") having a channel region, a source region and a drain region all disposed within the active semiconductor region. The FET has a longitudinal direction in a direction of a length of the channel region, and a transverse direction in a direction of a width of the channel region. A dielectric stressor element having a horizontally extending upper surface extends below a portion of the active semiconductor region. The dielectric stressor element shares an edge with the active semiconductor region, the edge extending in a direction away from the upper surface. In particular structures, two or more dielectric stressor elements are provided at locations opposite from each other in the longitudinal and/or transverse directions of the FET.

9 Claims, 8 Drawing Sheets

TRANSISTOR WITH DIELECTRIC STRESSOR ELEMENTS

BACKGROUND OF THE INVENTION

The present invention relates to semiconductor devices and processing. More particularly, the invention relates to semiconductor devices with dielectric stressor elements and methods of making the same.

A compressive stress or tensile stress can be applied to some types of transistors to increase their performance. In particular, the performance of a p-type field effect transistor ("PFET") improves when a longitudinal (in the direction of current flow) compressive stress is applied to the channel region. On the other hand, the performance of an n-type field effect transistor ("NFET") improves when a longitudinal tensile stress is applied to the channel region.

Various structures have been proposed for imparting a compressive stress or tensile stress to such transistors. In some cases, it has been proposed to provide one or more stressor elements in proximity with an NFET or PFET for applying a beneficial stress to the transistor. For example, commonly assigned U.S. Patent Publication No. 2004/0113174 describes a way of embedding dielectric stressor elements in isolation regions at exterior edges of an active semiconductor region which houses an NFET or a PFET. In such case, the dielectric stressor element and the isolation region are merged. While enabling efficiencies, these isolation-stressor elements require that a design point be reached in which potentially conflicting requirements for the stress-applying function, the isolation function and the processing needed to fabricate them are all simultaneously satisfied.

Thus, according to the known art, dielectric stressor elements used for applying stresses to an NFET or PFET are constrained to the locations at which isolation regions are placed. To overcome this constraint, it is clear that further improved structures and processing are awaited.

SUMMARY OF THE INVENTION

The structures and methods provided according to embodiments of the invention herein allow the location of a dielectric stressor element used with a PFET or an NFET, e.g., the placement, dimensions, edges, etc., of such stressor element, to be different from the location of an isolation region used to isolate the PFET or NFET. This is accomplished by way of a "burled" dielectric stressor element. As a buried dielectric stressor element, it is not constrained to locations outside the exterior edges of the active semiconductor region, as in the case of isolation regions. Indeed, the buried dielectric stressor element extends horizontally under a portion of the active semiconductor region, the dielectric stressor element having an upper surface which underlies the active semiconductor region. An edge of the buried dielectric stressor element that is shared with the active semiconductor region extends in a direction away from the upper surface. According to a preferred embodiment of the invention, such edge can be made closer to the channel region of the PFET or NFET than the edge of a trench isolation region could be located.

Therefore, according to an aspect of the invention, a chip is provided which includes an active semiconductor region and a field effect transistor ("FET") having a channel region, a source region and a drain region all disposed within the active semiconductor region. The FET has a longitudinal direction in a direction of a length of the channel region, and a transverse direction in a direction of a width of the channel region. A dielectric stressor element having a horizontally extending upper surface underlies a portion of the active semiconductor region. The dielectric stressor element shares an edge with the active semiconductor region, the edge extending in a direction away from the upper surface.

According to one or more preferred aspects of the invention, the dielectric stressor element is a first dielectric stressor element. A second dielectric stressor element is provided at a location which is opposite the first dielectric stressor element in a longitudinal or transverse direction of the FET.

According to one or more preferred aspects of the invention, the first dielectric stressor element underlies a first portion of active semiconductor region including a portion of the source region, and the edge is a first edge of the active semiconductor region. Such FET includes a second dielectric stressor element having a horizontally extending upper surface underlying a portion of the drain region of the active semiconductor region, the second dielectric stressor element sharing a second edge with the active semiconductor region, the second edge extending in the at least generally vertical direction to the upper surface of the second dielectric region.

According to one or more preferred aspects of the invention, the FET further includes a gate conductor having a conductive portion overlying the channel region, the conductive portion having a first vertically oriented gate edge and a second vertically oriented gate edge opposite the first gate edge, wherein the edge of the first dielectric stressor element is aligned with the first gate edge and the edge of the second dielectric stressor element is aligned with the second gate edge.

According to one or more preferred aspects of the invention, the FET is an n-type FET ("NFET") and the first dielectric stressor element and second dielectric stressor element, when present, applies a tensile stress to the channel region of the NFET.

According to one or more preferred aspects of the invention, the active semiconductor region is bounded in the longitudinal and transverse directions by edges of a trench isolation region, wherein the dielectric stressor element contacts entire lengths of the all of the edges of the trench isolation region.

According to one or more preferred aspects of the invention, the FET is a p-type FET ("PFET") and the first dielectric stressor element applies a compressive stress to the channel region of the PFET.

According to one or more preferred aspects of the invention, the FET is a p-type FET ("PFET") and the first and second edges are spaced apart in the longitudinal direction, and the stress applied by the first and second dielectric stressor elements is compressive.

According to one or more further preferred aspects of the invention, the active semiconductor region further includes a third vertically oriented edge and a fourth vertically oriented edge opposite the third edge, the third and fourth edges being spaced apart in the transverse direction, the chip further comprising a third dielectric stressor element underlying a portion of the channel region adjacent to the third edge and a fourth dielectric stressor element underlying a portion of the channel region adjacent to the fourth edge, the third and fourth stressor elements applying a tensile stress in a transverse direction of the PFET.

According to one or more preferred aspects of the invention, the first dielectric stressor element and second dielectric stressor element when present, includes a buried region including an oxide of a semiconductor, the semiconductor having a same composition as a semiconductor included in the active semiconductor region.

According to one or more preferred aspects of the invention, the first dielectric stressor element and second dielectric stressor element when present includes a buried region of a tensile-stressed oxide of a semiconductor, the semiconductor having a same composition as a semiconductor included in the active semiconductor region, and the chip further includes a trench isolation region overlying the buried region of tensile-stressed oxide.

According to one or more preferred aspects of the invention, the first dielectric stressor element and second dielectric stressor element when present includes a buried region of a compressive-stressed oxide of a semiconductor included in the active semiconductor region, the chip further comprising a trench isolation region overlying the buried region of compressive-stressed oxide.

According to one or more preferred aspects of the invention, the edge of the first dielectric stressor element and second dielectric stressor element when present is photolithographically defined.

According to one or more preferred aspects of the invention, the active semiconductor region is a first active semiconductor region, the chip further comprises a second active semiconductor region extending from an edge of the trench isolation opposite from the first active semiconductor region, and the dielectric stressor element underlies a portion of the second active semiconductor region.

According to another aspect of the invention, a method is provided for fabricating a field effect transistor ("FET") device. In such method a porous semiconductor region is formed which extends in horizontal directions below a portion of an active semiconductor region of a substrate. The porous semiconductor region is oxidized to form a dielectric stressor element. A field effect transistor ("FET") having a channel region, a source region and a drain region are formed which are all disposed within the active semiconductor region, such that the dielectric stressor element applies a stress to the channel region of the FET. In such method, the porous semiconductor region is formed with a selected degree of porosity, the selected degree of porosity determining whether the stress is tensile or compressive.

According to one or more preferred aspects of the invention, the step of forming the porous semiconductor region includes implanting a p-type dopant into a silicon region of the substrate through an opening in a mask, supplying an anodization current to the substrate in presence of hydrogen fluoride to form the porous silicon region and baking the substrate in presence of hydrogen.

According to one or more preferred aspects of the invention, the step of implanting the dopant is performed while the region is exposed at a major surface of the substrate and the method further comprises growing an epitaxial layer of the semiconductor to overlie the implanted region prior to the step of supplying the anodization current to the substrate in presence of hydrogen fluoride to form the porous silicon region, the active semiconductor region being disposed in the epitaxial layer.

According to one or more preferred aspects of the invention, the region of the semiconductor substrate underlies the active semiconductor region when the step of implanting the region is performed.

According to one or more preferred aspects of the invention, the boundaries of the dielectric stressor element or elements are determined photolithographically in accordance with the opening in the mask.

DETAILED DESCRIPTION

New ways of applying a compressive stress and/or a tensile stress to the channel region of a PFET or an NFET transistor are provided according to the embodiments of the present invention that offer simple processing and which are integratable into present methods of manufacturing PFET and NFET transistors of integrated circuits or "chips". According to the embodiments of the invention described herein, one or more buried dielectric stressor elements are provided which underlie portions of the active semiconductor region of a semiconductor device.

Figure 1A:
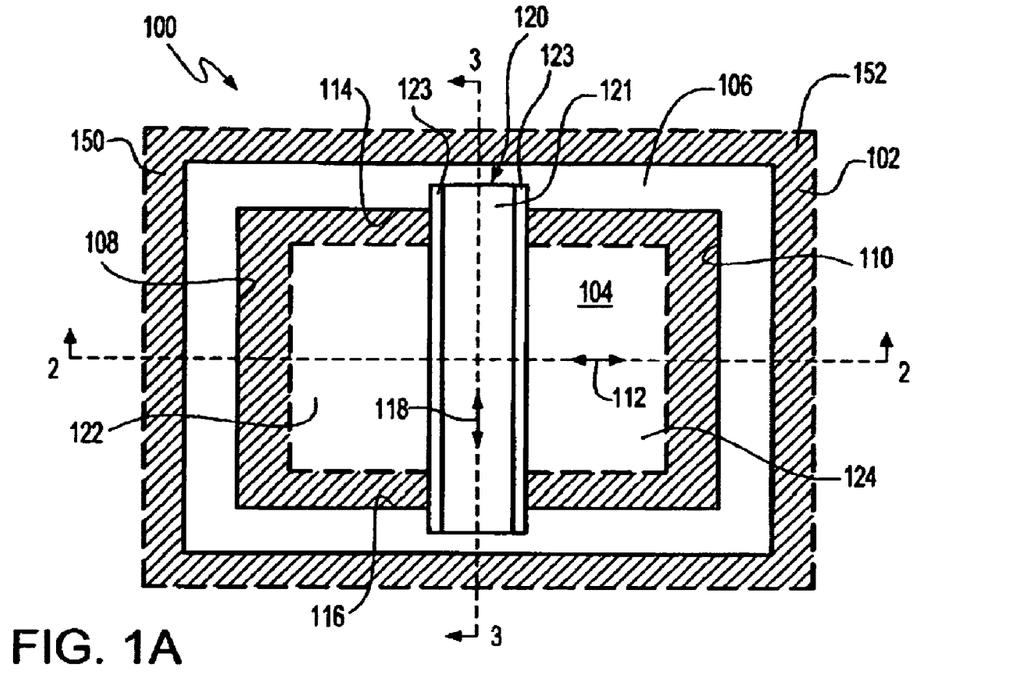
FIG. 1A is a face-up plan view of an NFET in accordance with an embodiment of the invention.

FIG. 1A is a face-up plan view illustrating an NFET 100 and a buried dielectric stressor region 102 used to apply a tensile stress to a channel region (not visible in FIG. 1A) of the NFET. As illustrated in FIG. 1A, the NFET 100 includes an active semiconductor region 104 which is bounded by an isolation region, illustratively being a trench isolation region, e.g., a shallow trench isolation ("STI") region 106. The STI region 106 thus defines the boundaries or "edges" of the active semiconductor region 104 including a first edge 108 and a second edge 110 which is opposite the first edge in a longitudinal direction 112 of the NFET. The STI region 106 further defines a third edge 114 and a fourth edge 116 of the active semiconductor region 104 which is opposite from the third edge in a transverse direction 118 of the NFET. As further shown in FIG. 1A, a gate 120 including a gate conductor 121 and dielectric sidewalls or spacers 123 overlies the active semiconductor region between a source region 122 and a drain region 124 that are provided in the active semiconductor region.

Figure 2:
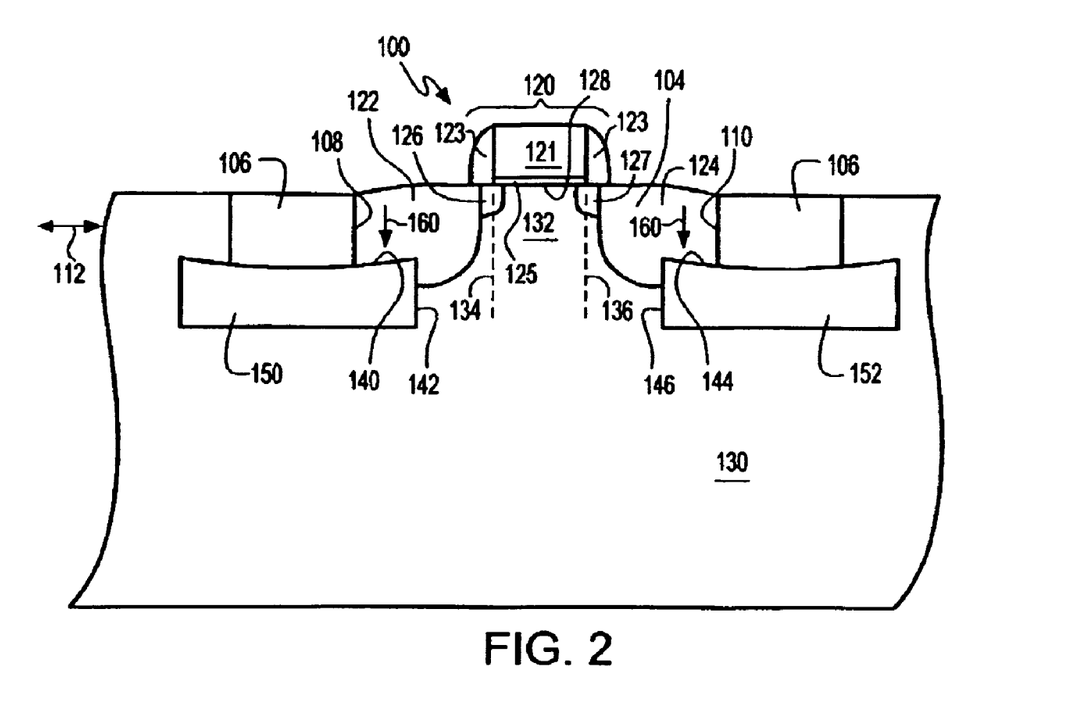
FIG. 2 is a sectional view of the NFET shown in FIG. 1A through line 2-2 of FIG. 1A.

FIG. 2 is a sectional view of NFET 100 through lines 2-2 of FIG. 1A. As shown in FIG. 2, the NFET is provided in a bulk semiconductor substrate 130. As further illustrated therein, the gate 120 overlies a face 128 of the active semiconductor region 104, the face defining a major surface of the active semiconductor region. Specifically, the gate 120, which includes a gate conductor 121 and spacers 123, overlies a channel region 132 of the NFET within the active semiconductor region and is spaced therefrom by a gate dielectric 125. Edges of the channel region 132 are determined by the locations in the longitudinal direction of a first edge 134 of the gate conductor and a second gate edge 136 opposite thereto. The source region 122 including an optional extension and/or halo region 126 extends from the vicinity of the first gate edge 134 to the first edge 108 of the active semiconductor region at STI region 106. The drain region 124 including an optional extension and/or halo region 127 extends from the vicinity of the second edge 136 of the channel region to the second edge 110 of the active semiconductor region at STI region 106.

As illustrated in FIG. 2, a first buried dielectric stressor element 150 underlies a portion of the active semiconductor region including a portion of source region 122. The first buried dielectric stressor element 150 has a generally horizontal upper surface 140 (i.e., one extending in the longitudinal direction 112 and transverse direction of the FET). As the first dielectric stressor region does not underlie the entirety of the active semiconductor region, the first dielectric stressor region shares an edge 142 with the active semiconductor region. The edge extends in a downward direction away from the generally horizontal upper surface 140, such direction having a vertical component. A second buried dielectric stressor element 152 underlies a portion of the active semiconductor region including a portion of the drain region 124. The second buried dielectric stressor element 152 also has a generally horizontal upper surface 144. Similar to the first dielectric stressor region, the second dielectric stressor region shares an edge 146 with the active semiconductor region, the edge 146 extending in a downward direction away from the generally horizontal upper surface 144.

Figure 3:
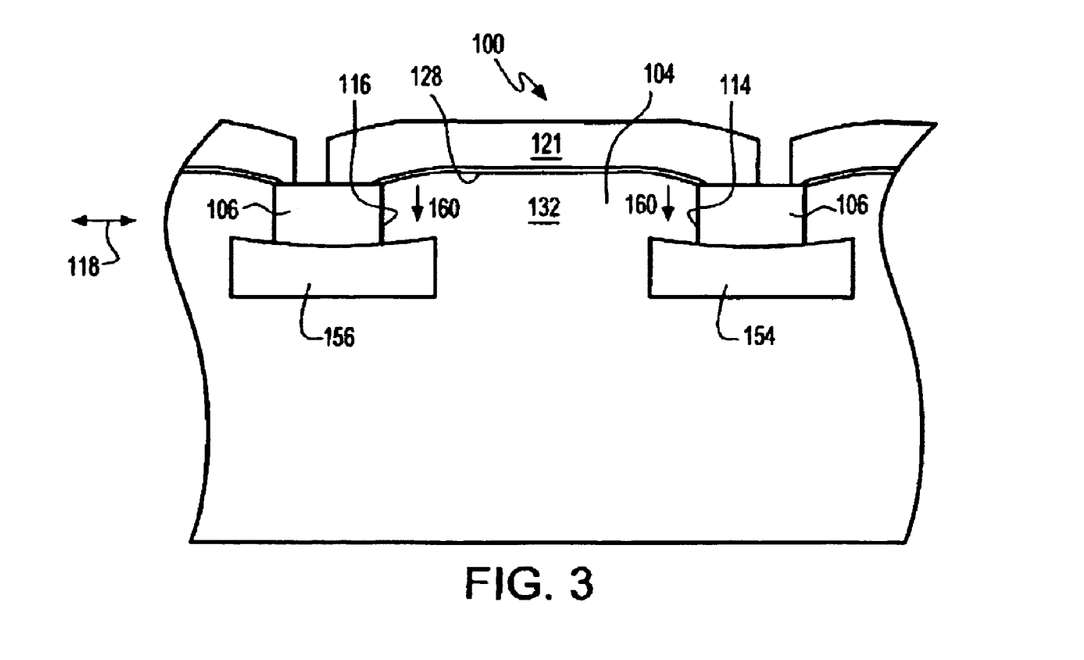
FIG. 3 is a sectional view of the NFET shown in FIG. 1A through line 3-3 of FIG. 1A.

FIG. 3 is a further sectional view of the NFET 100 through lines 3-3 of FIG. 1A which runs along the transverse direction 118, cutting through the gate conductor 121 and channel region 132. As shown in FIG. 3, a third buried dielectric stressor element 154 and a fourth buried dielectric stressor element 156 underlie the third edge 114 and fourth edge 116 of the active semiconductor region 104, respectively. Here, each of the third and fourth stressor elements applies a tensile stress which places the channel region 132 in tension in the transverse direction 118.

Referring again to FIG. 1A, in a preferred embodiment, the first and second stressor elements 150, 152 are portions of a single buried dielectric stressor region 102 which underlies a periphery of the FET along the entirety of the first (108), second (110), third (114) and fourth (116) edges of the active semiconductor region 104. In such case, the single stressor region 102 applies tensile stress to the channel region 132 of the NFET in both the longitudinal and transverse directions of the transistor.

Figure 1B:
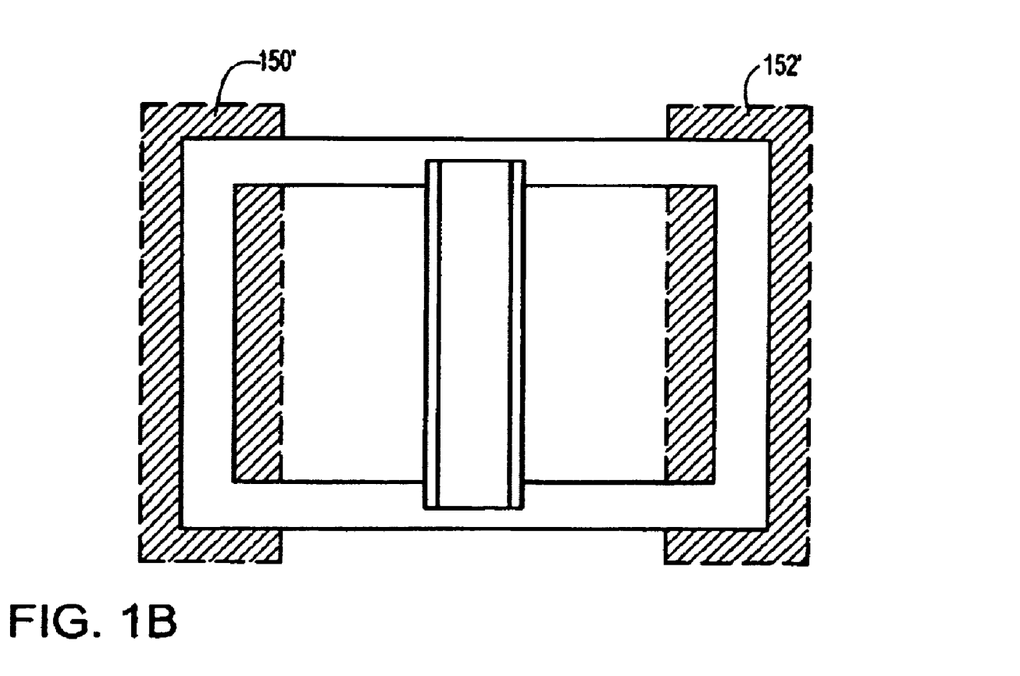
FIG. 1B is a face-up plan view of an NFET in accordance with a variation of the embodiment of the invention illustrated in FIG. 1A.

However, the first and second dielectric stressor elements can be separate unconnected structures as shown in a face-up plan view at 150' and 152' in FIG. 1B, both in this and other embodiments of the invention disclosed herein. In that case, the first and second dielectric stressor elements 150, 152 apply a tensile stress to the active semiconductor region 104 which places the channel region 132 in tension in the longitudinal direction 112.

Referring now to FIG. 4 through FIG. 7, a method of manufacturing the FET 100 (FIG. 1A) will now be described. Such method utilizes a process similar to that described in commonly assigned U.S. Patent Publication No. 2005/0067294 to Choe et al. In Choe et al., a region of a silicon substrate is implanted and treated to form a buried oxide layer of a silicon-on-insulator ("SOI") substrate. A porous silicon region is formed by Ion Implantation of a p-type dopant (for example, Ga, Al, B and $BF_2$) and subsequent anodization. The porous silicon region is then oxidized to form the buried oxide layer.

Figure 4:
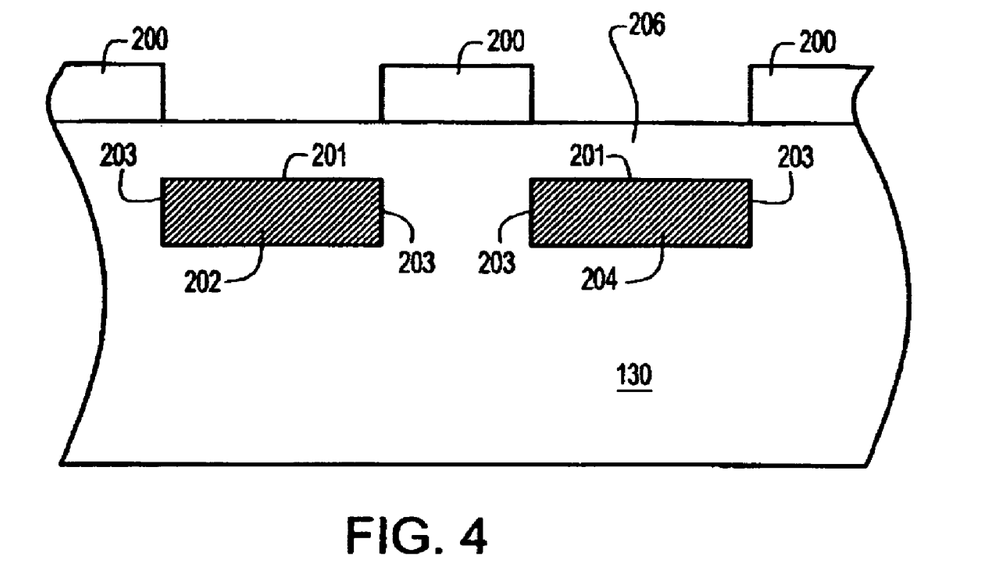
FIGS. 4 through 7 illustrate steps in a method of fabricating an FET (NFET or PFET) in accordance with an embodiment of the invention.

In the present method, a process similar to that described in Choe et al. is used to form buried dielectric stressor elements which underlie only portions (not all) of a transistor in an active semiconductor region. As shown in FIG. 4, a masking layer 200, e.g., a photoresist is patterned, and buried regions 202, 204 underlying a major surface 207 of the substrate 130 are implanted with a p-type dopant. The dopant concentration can range from about $1 \times 10^{19} cm^{-3}$ to about $5 \times 10^{20} cm^{-3}$ or higher. However, in any case, the achieved boron concentration must be significantly higher, i.e., one or more orders of magnitude higher than a normal (p-) p-type dopant concentration in the single-crystal silicon. Preferably, the dopant consists essentially of boron (B) or boron fluoride ($BF_2$), but gallium (Ga) and aluminum (Al) can be used instead. The depth to which ions are implanted into the semiconductor substrate determines the thickness of the dielectric stressor element and its depth below the major surface 207. The depth of the implant, in turn, is selected in accordance with the energy at which the implant is conducted. As this implant is performed through a photolithographically patterned masking layer, the process of implanting regions 202, 204 defines the edges 203 of the implanted regions, these edges 203 extending in a direction away from the horizontal upper surfaces 201 of the implanted regions.

Thereafter, the masking layer 200, e.g., a photoresist layer is stripped and the semiconductor substrate undergoes an anodization process to convert the pocket p-doped regions into buried porous semiconductor regions. The pocket regions become porous semiconductor regions as a result of the anodization process.

The anodization process is as follows. The semiconductor substrate 130, which preferably consists essentially of silicon and which has buried p-type implanted pocket regions is placed or preferably submerged in a bath containing a solution of hydrogen fluoride (HF), as well as a platinum electrode. The semiconductor substrate 130 is connected to a positive terminal of a current source, and the platinum electrode is connected to the negative terminal of that current source is connected in conductive communication with the current source that is connected to the positive terminal. The current source supplies an anodization current to the semiconductor substrate and the HF solution which controls the anodization process. In the presence of the anodization current, the HF solution readily diffuses through the single crystal semiconductor (silicon) to the higher concentration p-type doped pocket regions.

Figure 5:
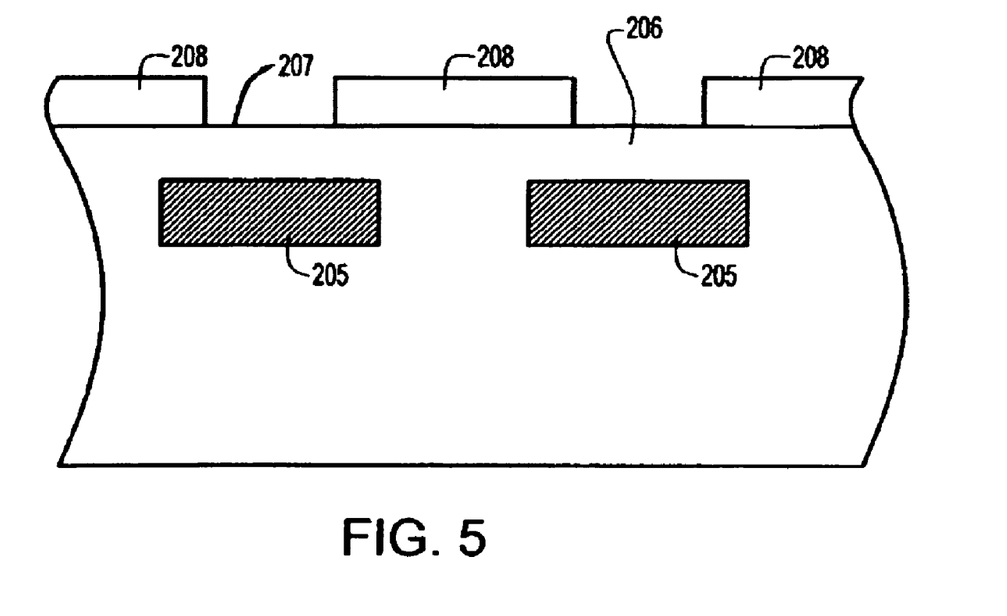

In those higher concentration pocket regions, the HF solution reacts with the highly doped p-type silicon to form porous silicon pocket regions 205 as shown in FIG. 5. This step is performed prior to forming an additional masking layer 208 as will be described below. The anodization current is in the range of 1 $mA/cm^2$ to 100 $mA/cm^2$, depending on the degree of porosity or density of the porous silicon regions 205 which are to result from this process. Both the concentration of boron or other p-type dopant in the silicon and the magnitude of the anodization current can be used to control the degree of porosity. That is, these parameters control the density of the buried pocket regions as measured by the mass of silicon the remains within each buried pocket region divided by its volume. For example, a low porosity region, that is, a region having a relatively high density, is one which has a density of greater than about 44% of the density of the original silicon substrate. On the other hand, a high porosity region, that is, a region having a relatively low density, is one which has a density of less than about 44% of the density of the original silicon substrate.

After anodization, the substrate is then subjected to a hydrogen bake, which removes most of the implanted boron remaining in the silicon. It is necessary to eliminate high concentrations of boron from the silicon substrate at this stage in order to avoid such high concentrations from interfering with processes used to subsequently define the differently doped regions of a transistor, i.e., the channel region, the source and drain regions, halo and/or extension regions. The hydrogen bake is conducted at temperatures ranging from about 800 degrees centigrade ("C.") to 1,000 degrees C., for periods ranging from about 30 seconds to 30 minutes.

After the anodization and post-bake processes, regions of porous silicon remain in locations which are at least generally coextensive with the pocket regions. The porous silicon regions are regions which contain a multiplicity of voids. As viewed with an electron microscope, the porous silicon regions have an appearance similar to a sponge or foam material, having large numbers of voids which are supported together by connecting structure of the remaining silicon material. The degree of porosity in the porous silicon regions is determined at least in part by the initial concentration of boron within the buried pocket regions. As described above, by appropriately selecting the dose of boron that is implanted into the pocket regions and/or by controlling the amount of anodization current, it is possible to remove little mass or much greater mass of the silicon material from the buried pocket regions.

Figure 6:
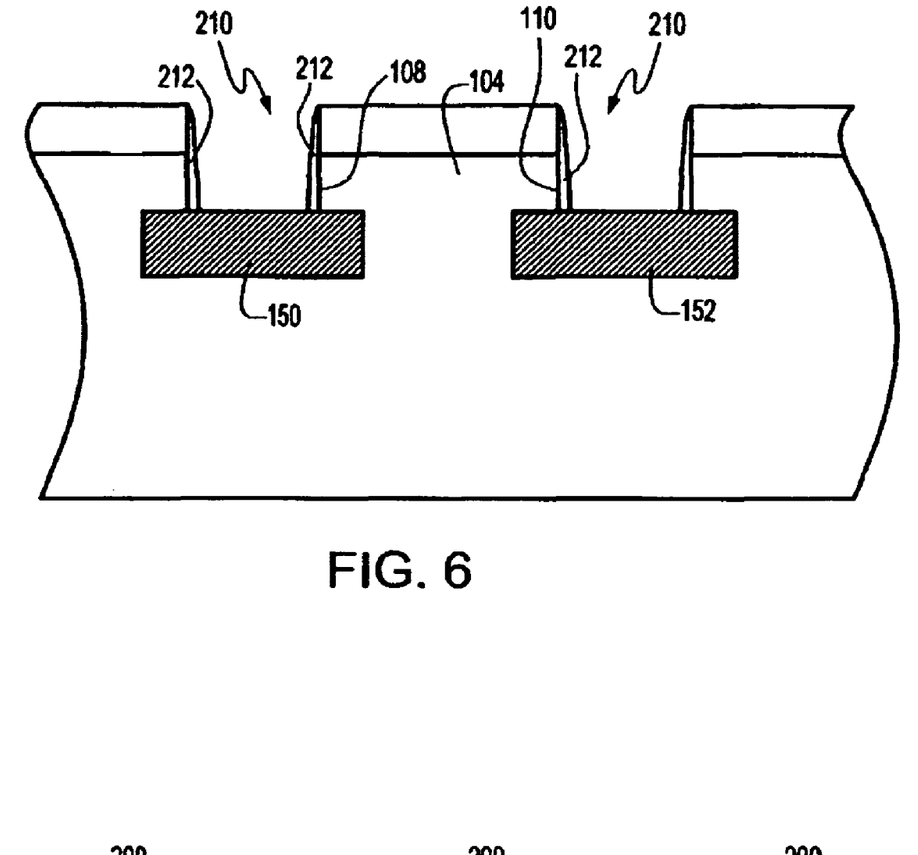

Next, as illustrated in FIG. 5, another masking layer 208, e.g., a photoresist is deposited and patterned over the major surface 207 of the substrate. As shown in FIG. 6, the substrate is then patterned with this masking layer to form trenches 210 in the upper silicon layer 206 above the buried porous regions to define edges 108, 110 of the active semiconductor region 104. The trenches 210 are etched in locations which expose the porous silicon regions. Then, after appropriately protecting the edges of the active semiconductor region, as by forming spacers 212 of silicon nitride thereon, the exposed porous silicon regions are subjected to an oxidation process which forms the dielectric stressor elements 150, 152 described above with reference to FIG. 2.

Figure 7:
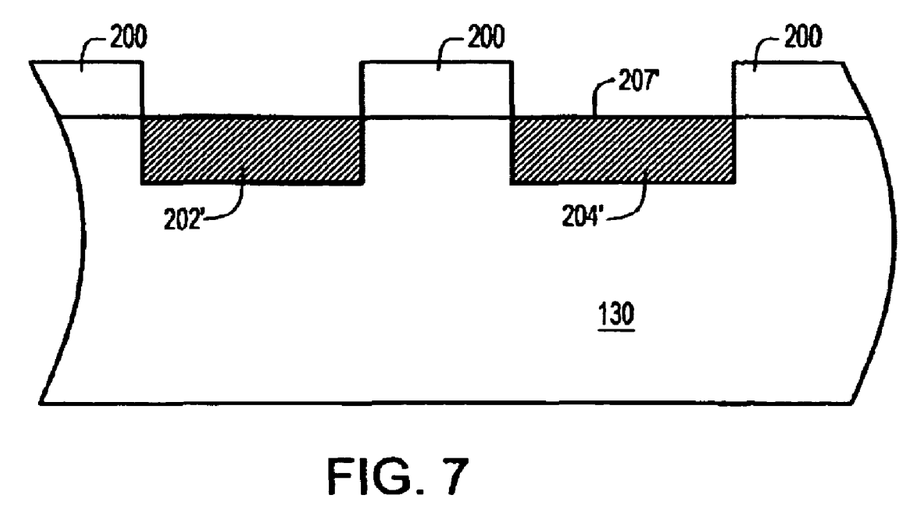

FIG. 7 illustrates a variation of the above-described embodiment in which the p-type dopant implants used to define the buried porous silicon regions are performed into regions at the exposed surface of the substrate rather than directly into buried subsurface regions as described above relative to FIG. 4. Specifically, as shown in FIG. 7, the initial implant is performed into regions 202', 204' which extend downward from an initial exposed major surface 207' of the substrate 130. Thereafter, the photoresist is stripped and the substrate is annealed to heal damage to the single-crystal silicon material from the implanting process. An epitaxial layer of silicon is then grown over exposed surfaces of the semiconductor substrate including the implanted regions to form a structure which appears in essential respects to be similar to the structure shown in FIG. 4. The epitaxial layer includes an active semiconductor region 206 in which a field effect transistor ("FET") will be formed later. As a result of growing the epitaxial semiconductor layer to form the structure as shown in FIG. 4, the implanted regions become buried implanted regions, also referred to as "pocket regions," each of these pocket regions having an upper surface 201 extending in a horizontal direction underlying the active semiconductor region 206. Specifically, the pocket regions extend in a horizontal direction parallel to the horizontal major surface 207 of the active semiconductor region 206. Each pocket region shares an edge 203 with the active semiconductor region 206, the edges 203 extending in a direction away from the horizontal direction in which the upper surface 201 extends. Thereafter, processing continues with the anodization of the implanted regions 202, 204 to form buried porous silicon regions 205 and subsequent processing in the manner described above with respect to FIGS. 5 and 6.

Depending on the degree of porosity within the porous regions, the dielectric stressor elements apply a compressive stress or a tensile stress to adjacent portions of the semiconductor substrate. This result is explained as follows. The volume of silicon dioxide is greater than silicon by a ratio of 2.25:1. Thus, when the proportion of silicon that remains within each porous silicon region is greater than 1/2.25 (i.e., the remaining mass is greater than about 44% of the original mass), the resulting silicon dioxide expands, causing the dielectric regions to become compressively stressed when the porous regions are oxidized. Stated another way, the resulting silicon dioxide expands to become compressively stressed when the porosity (i.e., the ratio of the amount of mass removed to the original mass) is less than 56%.

Conversely, when the porosity is greater than 56%, the resulting silicon dioxide contracts, causing the resulting dielectric regions to become tensile stressed. As mentioned above, the degree of porosity is at least partly determined by the conditions under which the regions are implanted with boron and the conditions of the etching process. In general, the degree of porosity is higher when the implanted boron concentration is higher, and the degree of porosity of lower when the implanted boron concentration is lower. Also, in general, higher porosity can be achieved when the current density of the etching process is higher. Conversely, lower porosity is achieved when the current density is lower.

In the processes described in the foregoing, the edges of the implanted regions are defined lithographically. Accordingly, it follows that the extent of the porous silicon regions are determined at least in part by such lithographic processing. Hence, locations of the edges of the dielectric stressor regions that result from oxidizing the porous silicon regions are determined at least in part by the lithographic processing used to mask the substrate when implanting the dopant to form the implanted regions.

After forming the dielectric stressor elements in the above manner, the trenches 210 are filled with a dielectric material such as an oxide of silicon (e.g., silicon dioxide) to form one or more trench isolation ("IT") regions or shallow trench isolation regions ("STI") regions 106, as shown in FIG. 1A. The dielectric fill is deposited via a high density plasma ("HDP") technique and/or other chemical vapor deposition ("CVD") technique including low pressure CVD ("LPCVD"), plasma enhanced CVD ("PECVD"), etc., which may involve deposition form a tetraethylorthosilicate ("TEOS") precursor, for example. The dielectric material can include a nitride, e.g., silicon nitride which lines interior walls of the trenches, prior to deposition of the dielectric fill.

After forming the buried dielectric stressor elements, the gate conductor 121, dielectric spacers 123, and source and drain regions 122, 124, including extension regions and/or halo regions 126, 127 are formed, as shown in FIG. 2, thus completing the FET 100 having the dielectric stressor elements 150, 152 as shown in the sectional view in FIG. 2 and having the dielectric stressor elements 154 and 156 as shown in FIG. 3.

Figure 8:
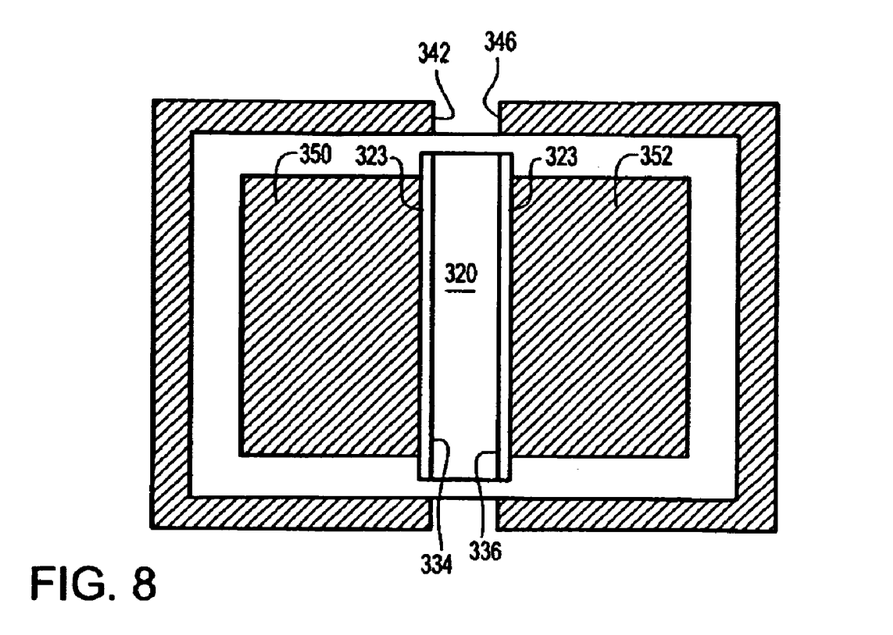
FIG. 8 is a face-up plan view of an NFET in a variation of an embodiment described above with reference to FIG. 1A through FIG. 3.

FIG. 8 illustrates a particular variation of the embodiment described above with reference to FIG. 1A through FIG. 3. In FIG. 8, sidewall dielectric regions, e.g., dielectric spacers 323 are disposed on walls of the gate conductor 320 along a first gate edge 334 and along a second gate edge 336. In this embodiment, the dielectric stressor elements 350, 352 are extended far in the longitudinal direction such that an edge 342 of the first dielectric stressor element is aligned with the first gate edge 334 of the gate conductor 320 and an edge 346 of the second dielectric stressor element is aligned with the second gate edge 336 of the gate conductor opposite from the first gate edge 334. This is a preferred placement of edges of the dielectric stressor elements. The extent that the edges of the dielectric stressor elements vary in their locations therefrom is determined by overlay tolerance between typically separate masking steps which are used to define the edges of the stressor elements in a particular step; and the first and second gate edges in a different masking step.

Figure 9:
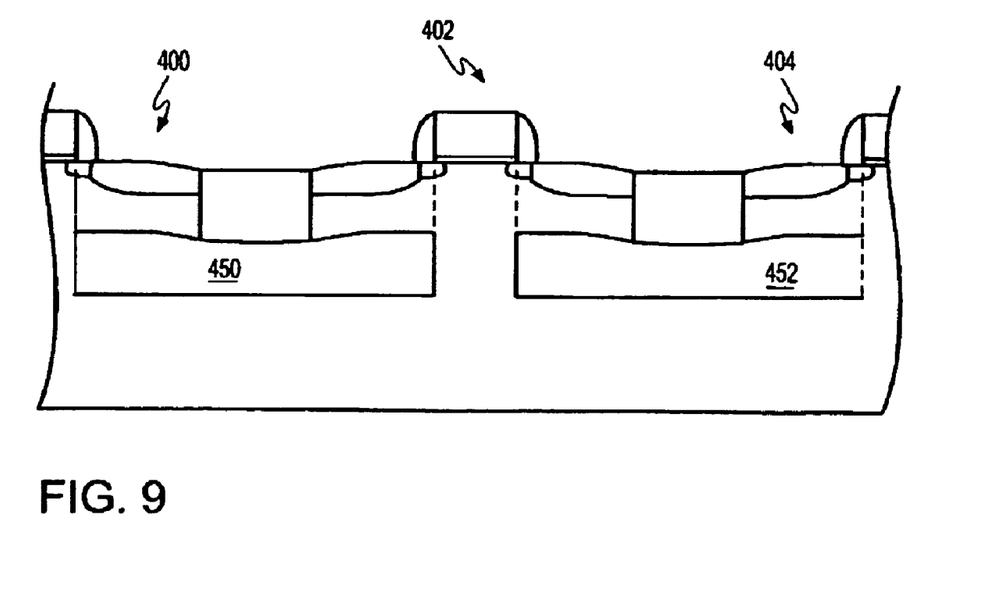
FIGS. 9 through 11 are sectional views illustrating an NFET and portions of neighboring NFETs in accordance with embodiments of the invention.

FIG. 9 is a partial sectional view illustrating a chip on which a plurality of NFETs 400, 402 and 404 are provided, each having a structure similar to that of FET 100 illustrated in the foregoing with respect to FIG. 1A through FIG. 3 and FIG. 8. As illustrated in FIG. 9, each of the dielectric stressor elements 450, 452 extends horizontally such that it underlies portions of active semiconductor regions of multiple NFETs. Specifically, the dielectric stressor element 450 underlies portions of the NFETs 400 and 402 and the dielectric stressor element 452 underlies portions of the NFETs 402 and 404.

Figure 10:
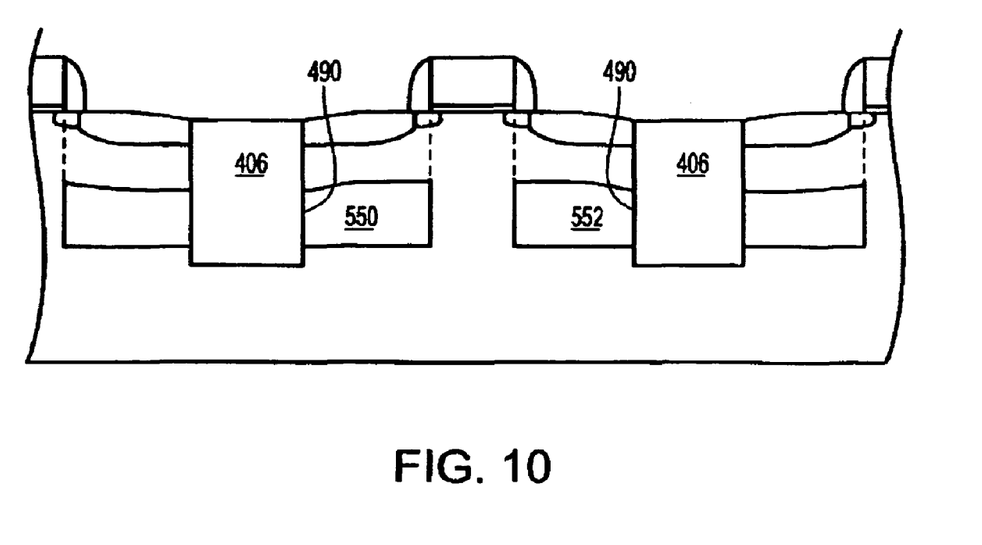

FIG. 10 illustrates a variation of the embodiment illustrated in FIG. 9 in which the STI regions 406 extend to a depth lower than bottom surfaces of the dielectric stressor elements 550, 552 such that the dielectric stressor elements have generally vertical edges 490 which are shared with edges of the STI regions 406.

Figure 11:
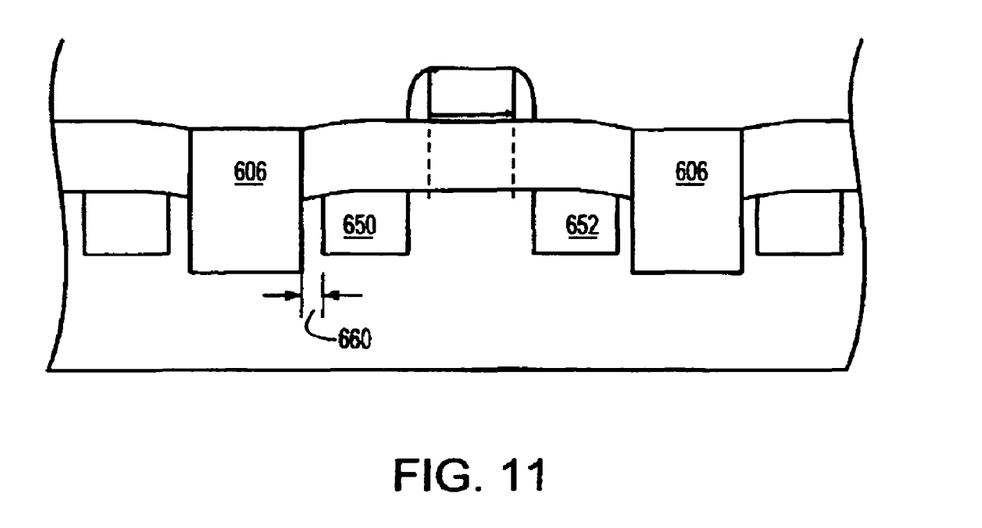

FIG. 11 is a sectional diagram along a longitudinal direction of a FET according to another variation of the embodiment described above relative to FIG. 9. In this case, edges of the dielectric stressor elements 650, 652 are separated at some distance 660 in the longitudinal direction of the FET from the edges of the STI regions 606. However, in the transverse direction (not shown), ends of the dielectric stressor elements 650, 652 meet edges of the STI region 606, that is edges of the STE such as edges 114, 116 (FIG. 1A) in the transverse direction of the FET. During processing, longitudinally extending trenches which are etched initially for forming the STI region at edges 114, 116 (FIG. 1A) reach those ends of buried porous silicon regions which occupy the space of the later-formed dielectric stressor elements. In such manner, oxidation of the porous silicon regions occurs from the ends which are exposed by the trenches.

Figure 12:
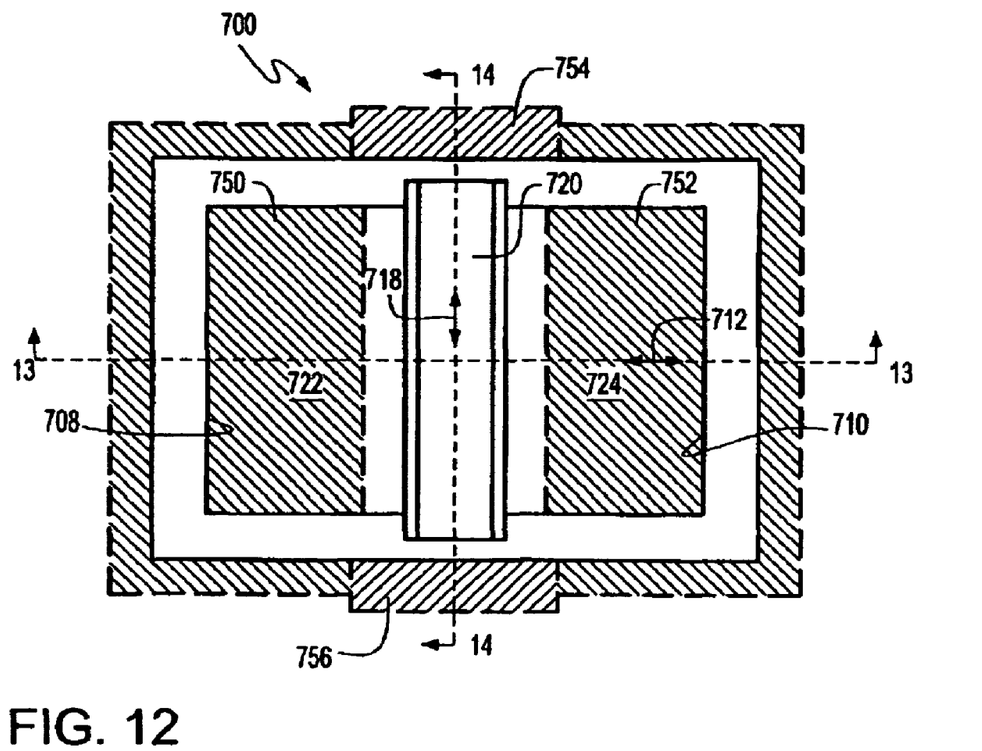
FIG. 12 is a face-up plan view of a PFET in accordance with an embodiment of the invention.

FIG. 12 illustrates an embodiment of a p-type field effect transistor ("PFET") 700. The PFET has a structure similar to that described above in relation to the NFET 100 (FIG. 1A), except as follows. Like the NFET, the PFET 700 includes first and second dielectric stressor elements 750, 752. However, these stressor elements are different from the tensile stressor elements of the NFET described above with reference to FIG. 1A through FIG. 3 and FIG. 8 through FIG. 11. Here, the dielectric stressor elements 750, 752 exert a compressive stress in a longitudinal direction 712 to the channel region of the PFET 700. In the view shown in FIG. 12, the channel region underlies the gate conductor 720 and is therefore not visible. Referring again to the fabrication process described above with reference to FIG. 4 through FIG. 7, the dielectric stressor elements preferably are formed by implanting a p-type dopant, e.g., boron into regions of the silicon substrate and then anodizing the implanted regions in contact with an HF-containing solution to form porous silicon regions. Compressive stress is produced when the porosity of the porous silicon regions, i.e., the percentage of mass removed to form the porous silicon regions is less than 56% prior to the step of oxidizing the porous silicon regions. For example, when the percentage of mass removed from the porous silicon regions is 30% of the original mass, the oxide that is produced by oxidation of the porous silicon regions is compressively stressed.

As shown in FIG. 12, the dielectric stressor element 750 underlies portions of the source region 722 extending from a first edge 708 of the active semiconductor region. On the other hand, the dielectric stressor element 752 underlies portions of the drain region 724 extending from a second edge 710 of the active semiconductor region.

in addition to the stressor elements 750, 752, the PFET 700 optionally and preferably also includes third and fourth dielectric stressor elements 754, 756, respectively. These stressor elements exert a stress to the channel region in a transverse direction 718 thereof. However, unlike the other stressor elements, these stressor elements 754, 756 exert a tensile stress (in the transverse direction) to the channel region. The performance of a PFET is increased when tensile stress is applied in the transverse direction.

Figure 13:
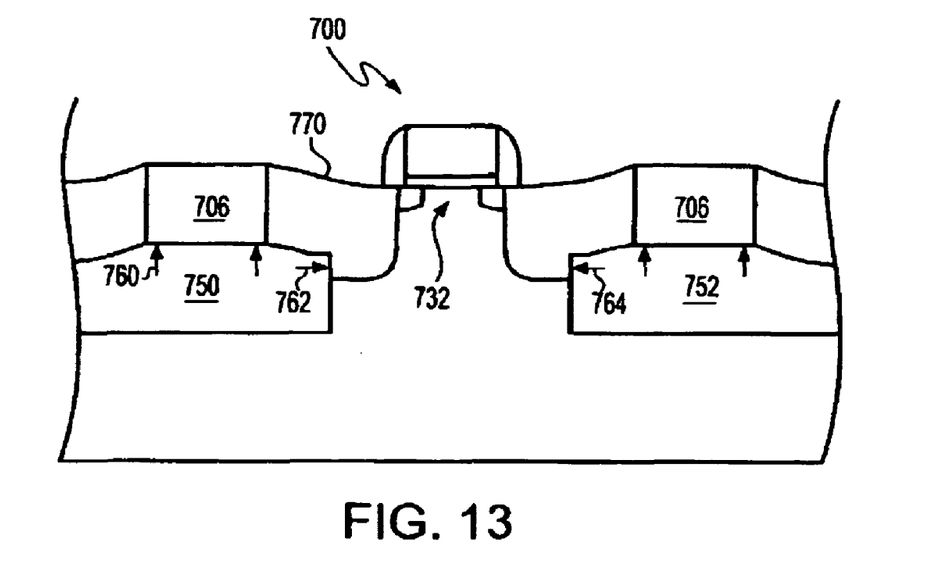
FIG. 13 is a sectional view of the PFET illustrated in FIG. 12 through line 13-13 of FIG. 12.

To further illustrate the structure of PFET 700, FIG. 13 is a view illustrating a section through PFET 700 along lines 13-13 of FIG. 12. The dielectric stressor elements 750, 752 exert an outwardly directed stress. Thus, these stressor elements 750, 752 exert stresses in the directions 762, 764 upon portions of the active semiconductor region, thus exerting a compressive stress upon the channel region 732 of the PFET 700. In addition, depending upon the material of the STI regions 706, the stressor elements 750, 752 may also exert a compressive stress in an upward direction 760 towards an upper surface 770 of the active semiconductor region.

Figure 14:
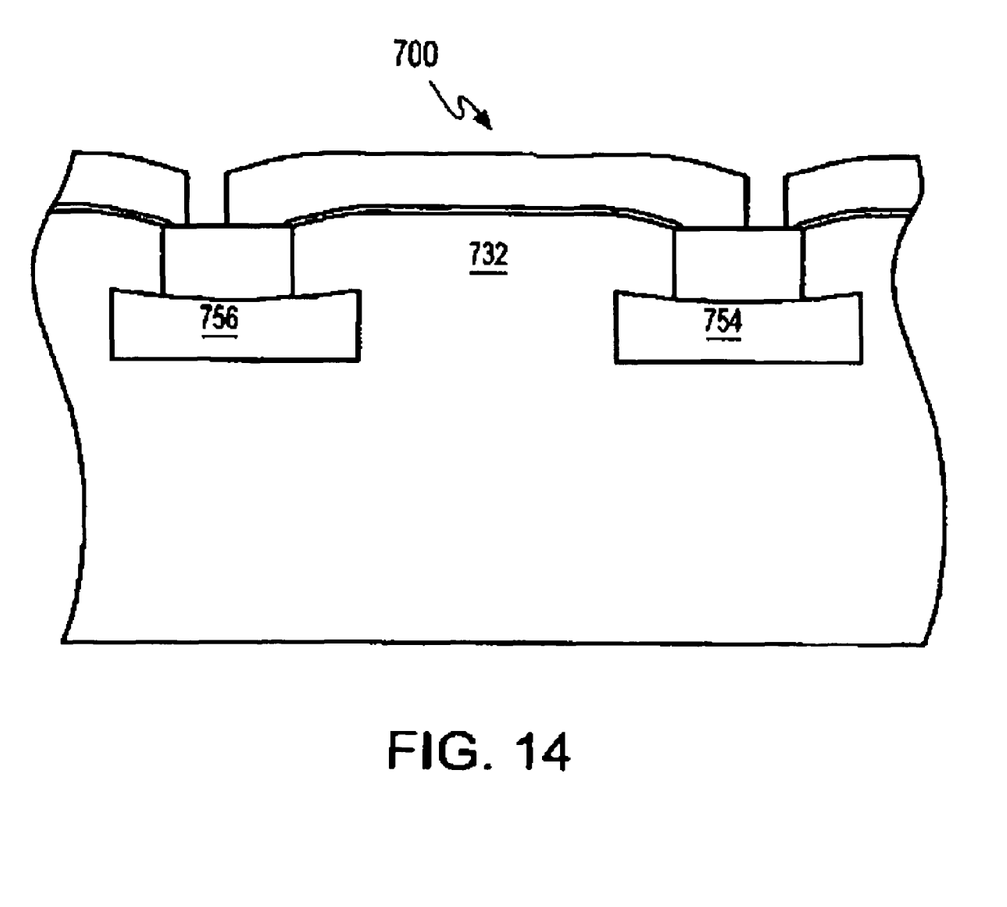
FIG. 14 is a sectional view of the PFET illustrated in FIG. 12 through line 14-14 of FIG. 12.

FIG. 14 is a view illustrating a section through PFET 700 along lines 14-14 of FIG. 12. The dielectric stressor elements 754, 756 exert a tensile stress upon the channel region 732 of the PFET 700. For that reason, the sectional view of PFET 700 in FIG. 14 is similar to the sectional view of NFET 100 in FIG. 3.

In a variation of the embodiment of the PFET 700 shown in FIG. 12, the PFET can have only the dielectric stressor elements 750, 752 without having the stressor elements 754, 756. Alternatively, the PFET can have only the dielectric stressor elements 754 and 756 without having the stressor elements 750, 752. In addition, the locations of the dielectric stressor elements can vary in relation to the locations of the STI regions, as in the various embodiments of NFETs shown in FIG. 9 through FIG. 11.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A chip, comprising:
    an active semiconductor region;
    a field effect transistor ("FET") having a channel region, a source region and a drain region all disposed within said active semiconductor region, said FET having a longitudinal direction in a direction of a length of said channel region, and a transverse direction in a direction of a width of said channel region, wherein said longitudinal and transverse directions are horizontal directions of said FET, and a vertical direction of said FET is transverse to said horizontal directions; and a dielectric stressor element having a horizontally extending upper surface underlying a portion of said active semiconductor region, said upper surface extending to an edge surface shared with said active semiconductor region, said edge surface extending in a vertically downward direction abruptly away from said upper surface, wherein said FET is an n-type FET ("NFET") and said dielectric stressor element applies a tensile stress to said channel region of said NFET.

2. The chip as claimed in claim 1, wherein said dielectric stressor element is a first dielectric stressor element, said first dielectric stressor element underlying a first portion of active semiconductor region including a portion of said source region, and said edge surface is a first edge surface of said active semiconductor region said NFET further including a second dielectric stressor element having a horizontally extending upper surface underlying a portion of said drain region of said active semiconductor region and extending to a second edge surface shared with said active semiconductor region, said second edge surface extending in a vertically downward direction abruptly away from said upper surface of said second dielectric stressor element, wherein said second dielectric stressor element applies a tensile stress to said channel region of said NFET.

3. The chip as claimed in claim 2, wherein said edge surface of said first dielectric stressor element is spaced apart from said first gate edge in a horizontal direction and said edge surface of said second dielectric stressor element is spaced apart from said second gate edge in a horizontal direction.

4. The chip as claimed in claim 2, wherein said NFET further includes a gate conductor having a conductive portion overlying said channel region, said conductive portion having a first vertically oriented gate edge and a second vertically oriented gate edge opposite said first gate edge, wherein said edge surface of said first dielectric stressor element is aligned with said first gate edge and said edge surface of said second dielectric stressor element is aligned with said second gate edge.

5. The chip as claimed in claim 1, wherein said active semiconductor region is bounded in said longitudinal and transverse directions by edges of a trench isolation region, wherein said dielectric stressor element contacts entire lengths of all of said edges of said trench isolation region.

6. The chip as claimed in claim 1, wherein said dielectric stressor element includes a buried region including an oxide of a semiconductor, said semiconductor having a same composition as a semiconductor included in said active semiconductor region.

7. The chip as claimed in claim 1, wherein said dielectric stressor element includes a buried region of a tensile-stressed oxide of a semiconductor, said semiconductor having a same composition as a semiconductor included in said active semiconductor region, and said chip further includes a trench isolation region overlying said buried region of tensile-stressed oxide.

8. The chip as claimed in claim 7, wherein said active semiconductor region is a first active semiconductor region, said chip further comprises a second active semiconductor region extending from an edge of said trench isolation opposite from said first active semiconductor region, and said dielectric stressor element underlies a portion of said second active semiconductor region.

9. The chip as claimed in claim 1, wherein said edge of said dielectric stressor element is photolithographically defined.

* * * * *